United States Patent [19]
Jiang

[11] Patent Number: 5,848,022
[45] Date of Patent: Dec. 8, 1998

[54] ADDRESS ENABLE CIRCUIT IN SYNCHRONOUS SRAM

[75] Inventor: Yong H. Jiang, Milpitas, Calif.

[73] Assignee: Integrated Silicon Solution Inc., Santa Clara, Calif.

[21] Appl. No.: 850,717

[22] Filed: May 2, 1997

[51] Int. Cl.$^6$ ..................................................... G11C 8/00
[52] U.S. Cl. .............. 365/230.08; 365/195; 365/230.06; 365/233; 365/194
[58] Field of Search ......................... 365/230.08, 230.06, 365/233, 195, 194

[56] References Cited

U.S. PATENT DOCUMENTS

5,596,537  1/1997  Sukegawa et al. ............ 365/230.08 X
5,748,553  5/1998  Kitamura ...................... 365/230.08 X

*Primary Examiner*—Do Hyun Yoo
*Attorney, Agent, or Firm*—Stephen M. Knauer; Flehr Hohbach Test Albritton & Herbert LLP

[57] ABSTRACT

A novel address enable circuit for use in a synchronous memory that includes a memory core. The address enable circuit includes an address latching circuit that outputs a synchronized address and latches a pre-decoded address when an input clock signal transitions from a first logical level to a second logical level so that the synchronized address identifies the pre-decoded address. The address enable circuit also includes a reset circuit that generates a reset signal that (1) does not indicate a reset when the latched chip enable signal indicates that the memory has been selected while the clock signal is at the second logical level, (2) indicates a reset when the latched chip enable signal indicates that the memory has not been selected while the clock signal is at the second logical level, and (3) does not indicate a reset while the clock signal is at the first logical level. The address latching circuit is reset when the reset signal indicates a reset so that the synchronized address identifies a disabled address that indicates that memory access to the memory core is disabled and is not reset when the reset signal does not indicate a reset.

12 Claims, 5 Drawing Sheets

ADDRESS ENABLE CIRCUIT IN SYNCHRONOUS SRAM

The present invention relates generally to address enable circuits for enabling and disabling access to memory. In particular, it pertains to such an address enable circuit in a synchronous SRAM (static random access memory) which provides decreased memory access times and decreased power consumption.

BACKGROUND OF THE INVENTION

In a memory system with multiple SRAMs, a memory access of an SRAM is performed when an external memory controller of the memory system outputs an address and chip enable signals that may include chip select signals and/or cycle type signals including a read/write signal, a burst signal, an idle (or deselect) signal. These chip enable signals in combination identify which of the SRAMs is to be accessed with the address. Some synchronous SRAMs include an address enable circuit that receives and combines the chip enable signal and the address for enabling and disabling access to the corresponding SRAM. Thus, in these synchronous SRAMs, the chip enable signal and the address are synchronized and power consumption is conserved.

Figure 1:
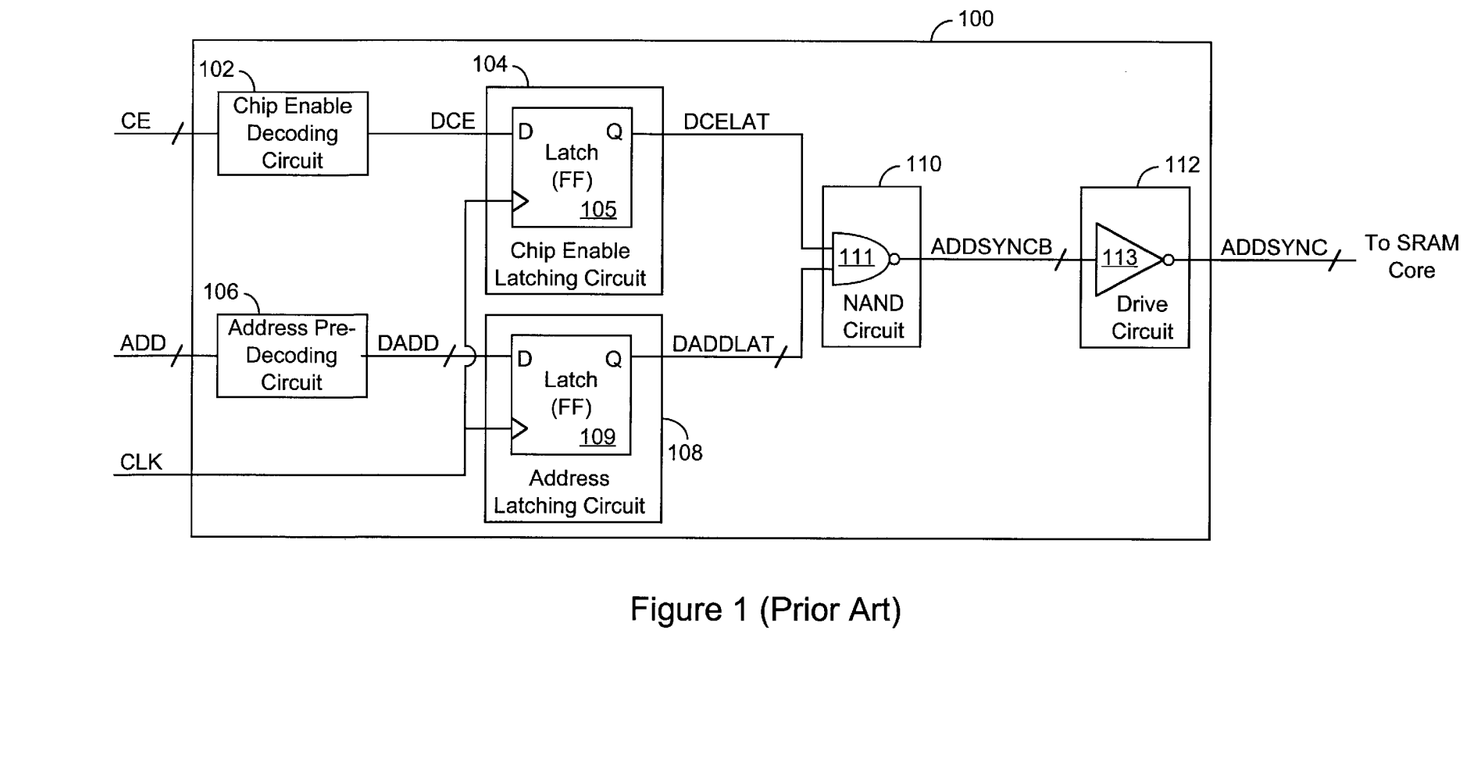
FIG. 1 is a block diagram of a conventional address enable circuit that is in the prior art.

For example, FIG. 1 shows a conventional address enable circuit 100 in such a synchronous SRAM. The address enable circuit 100 and the SRAM core of the SRAM are located on a corresponding SRAM chip. As just mentioned, the address enable circuit 100 is used to enable and disable the memory access to the SRAM core.

Specifically, the address enable circuit 100 includes a chip enable decoding circuit 102 that is coupled to the external memory controller for receiving input chip enable signals CE that identify which SRAM in the memory system is to be accessed. The chip enable decoding circuit 102 decodes the input chip enable signals CE to generate a one bit decoded chip enable signal DCE that indicates whether or not the SRAM that includes the address enable circuit 100 has been selected for a memory access.

The address enable circuit 100 also includes chip enable latching circuit 104 which comprises a latch 105, such as a flip-flop. The chip enable latching circuit 104 is coupled to the chip enable decoding circuit 102 for receiving the decoded chip enable signal DCE. The chip enable latching circuit 104 is also coupled to the external memory controller for receiving an input clock signal CLK. The chip enable latching circuit 104 then latches the decoded chip enable signal DCE on the rising edge of the input clock signal CLK so as to generate the latched chip enable signal DCELAT.

The address enable circuit 100 further includes an address pre-decoding circuit 106 that is coupled to the external memory controller for receiving an input address ADD. The address pre-decoding circuit 106 pre-decodes the input address ADD to generate a pre-decoded address DADD. For purposes to be explained shortly, the pre-decoded address DADD is pre-decoded at this point so that it will always contain at least one bit D that is high (i.e., at a logical high level).

The address enable circuit 100 also includes an address latching circuit 108 that is coupled to the address pre-decoding circuit 106 for receiving the pre-decoded address DADD. The address latching circuit 108 also receives the input clock signal CLK from the external memory controller. The address latching circuit 108 then latches the pre-decoded address DADD on the rising edge of the input clock signal CLK to generate the latched address DADDLAT. In order to do so, the address latching circuit 108 may comprise parallel latches 109, such as flip-flops, that each latch a corresponding bit D of the pre-decoded address DADD in response to the rising edge of the input clock signal CLK to generate a corresponding bit Q of the latched address DADDLAT.

The address enable circuit 100 also includes a NAND circuit 110 that is coupled to the chip enable latching circuit 104 and the address latching circuit 108 for respectively receiving the latched chip enable signal DCELAT and the latched address DADDLAT. The NAND circuit 110 NANDs the latched address DADDLAT with the latched chip enable signal DCELAT to generate a synchronized address ADDSYNC. In order to do so, the NAND circuit 110 has parallel NAND gates 111 with each NAND gate 111 receiving the latched chip enable signal DCELAT and a corresponding bit Q of the latched address DADDLAT. Thus, each bit Q of the latched address DADDLAT is NANDed with the latched chip enable signal DCELAT by the corresponding NAND gate 111 to generate a corresponding bit of the synchronized address ADDSYNC.

Moreover, as described earlier, the pre-decoded address DADD is pre-decoded so that it includes at least one bit D that is high. Thus, since the latched addresses DADDLAT identifies the pre-decoded address DADD, it has at least one bit Q that is high as well. Then, when the chip enable signal DCE is high and indicates that the corresponding SRAM has been selected, the latched address DADDLAT and the latched chip enable signal DCELAT are NANDed by the NAND circuit 110 to generate a synchronized address ADDSYNCB that is enabled and identifies the inverted form of the latched address DADDLAT. As a result, the synchronized address ADDSYNCB will also have at least one bit that is low and therefore will indicate that a memory access of the SRAM core is enabled. But, when the decoded chip enable signal DCE indicates that the corresponding SRAM has not been selected, the latched address DADDLAT and the latched chip enable signal DCELAT are NANDed by the NAND circuit 110 to generate a synchronized address ADDSYNCB that has each bit high and therefore does not identify the inverted form of the latched address DADDLAT. Thus, in this case, the synchronized address ADDSYNCB identifies an inverted form of a disabled address that indicates that a memory access of the SRAM core is disabled.

Furthermore, the address enable circuit 100 also includes a drive circuit 112 that is coupled to the NAND circuit 110 for receiving the synchronized address ADDSYNCB. The drive circuit 112 in response inverts the synchronized address ADDSYNCB to generate the synchronized address ADDSYNC and drives the SRAM core with the synchronized address ADDSYNC. In order to do so, the drive circuit includes a corresponding inverter gate 113 for each bit of the synchronized address ADDSYNCB. Each inverter gate 113 receives the corresponding bit of the synchronized address ADDSYNCB and inverts it to generate a corresponding bit of the synchronized address ADDSYNC. Each inverter gate 113 is therefore used to drive the SRAM core with the corresponding bit of the synchronized address ADDSYNC.

But, in synchronous SRAMs, the memory access time is dependent on the speed at which the synchronized address ADDSYNC is provided to the SRAM. And, in the conventional address enable circuit 100 just described, it is clear that the memory access time to the corresponding SRAM core is slowed since the speed at which the synchronized address ADDSYNC is generated is dependent on whichever of the latched address DADDLAT and the latched chip enable signal DCELAT is received last. In other words, since the decoded chip enable signal DCE and the pre-decoded address DADD must be latched and then combined (i.e., NANDed), the gate delays associated with the numerous gates required to do this necessarily slow the memory access time.

In order to remedy this problem, some conventional address enable circuits use a drive circuit 112 with large inverter gates 113 to drive the SRAM core more quickly with the synchronized address ADDSYNC. However, this results in much more power being consumed.

Furthermore, as indicated earlier, the NAND circuit 110 has parallel NAND gates 111 that each NAND the latched chip enable signal DCELAT with the corresponding bit Q of the latched address DADDLAT. As a result, the NAND circuit 110 has a large layout area on the corresponding SRAM chip. Moreover, the chip enable latching circuit 104 must consume a significant amount of power in driving each of the NAND gates 111 with the latched chip enable signal DCELAT.

SUMMARY OF THE INVENTION

In summary, the present invention is a novel address enable circuit for use in a synchronous memory that includes a memory core. The address enable circuit includes a chip enable decoding circuit, a chip enable latching circuit, an address pre-decoding circuit, a drive circuit, and a reset circuit.

In normal operation, the chip enable decoding circuit decodes an input chip enable signal to generate a decoded chip enable signal that indicates whether the memory has been selected. The chip enable latching circuit latches the decoded chip enable signal to generate a latched chip enable signal when an input clock signal transitions from a first logical level to a second logical level. The address pre-decoding circuit pre-decodes an input address to generate a pre-decoded address. The address latching circuit outputs a synchronized address and latches the pre-decoded address when the input clock signal transitions from the first logical level to the second logical level so that the synchronized address identifies the pre-decoded address. The drive circuit drives the memory core with the synchronized address.

However, the address enable circuit also includes a reset circuit that generates a reset signal that (1) does not indicate a reset when the latched chip enable signal indicates that the memory has been selected while the clock signal is at the second logical level, (2) indicates a reset when the latched chip enable signal indicates that the memory has not been selected while the clock signal is at the second logical level, and (3) does not indicate a reset while the clock signal is at the first logical level. The address latching circuit is reset when the reset signal indicates a reset so that the synchronized address identifies a disabled address that indicates that memory access to the memory core is disabled and is not reset when the reset signal does not indicate a reset.

DETAILED DESCRIPTION OF THE INVENTION

Figure 2:
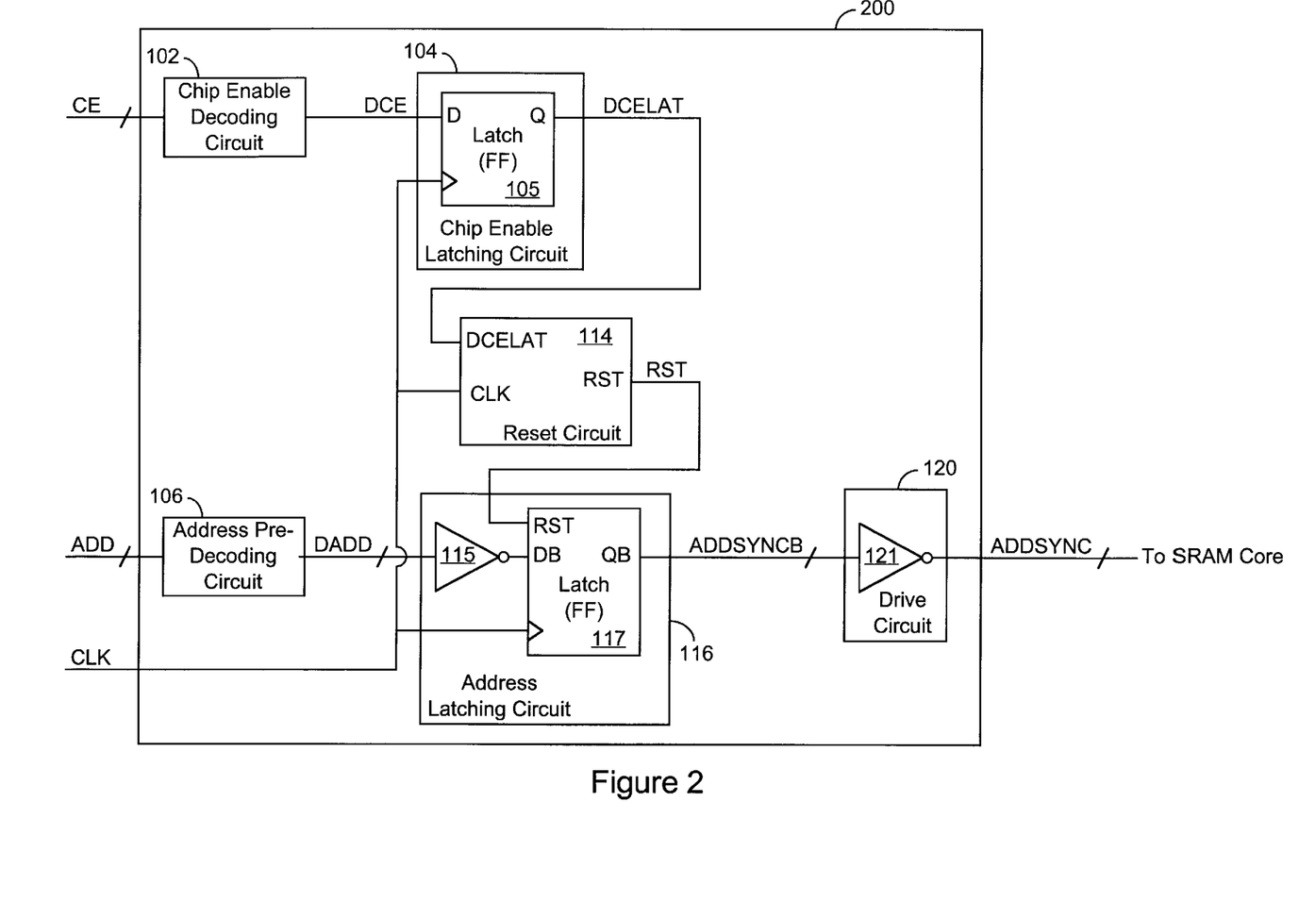
FIG. 2 is a block diagram of a novel address enable circuit in accordance with the present invention.

Referring to FIG. 2, there is shown a novel address enable circuit 200 for use in a synchronous SRAM. As with the conventional address enable circuit 100 shown in FIG. 1, the address enable circuit 200 includes a chip enable decoding circuit 102, a chip enable latching circuit 104 and an address pre-decoding circuit 106. However, unlike the conventional address enable circuit 100, it also includes a novel reset circuit 114, a novel address latching circuit 116, and a novel drive circuit 120.

Figure 3:
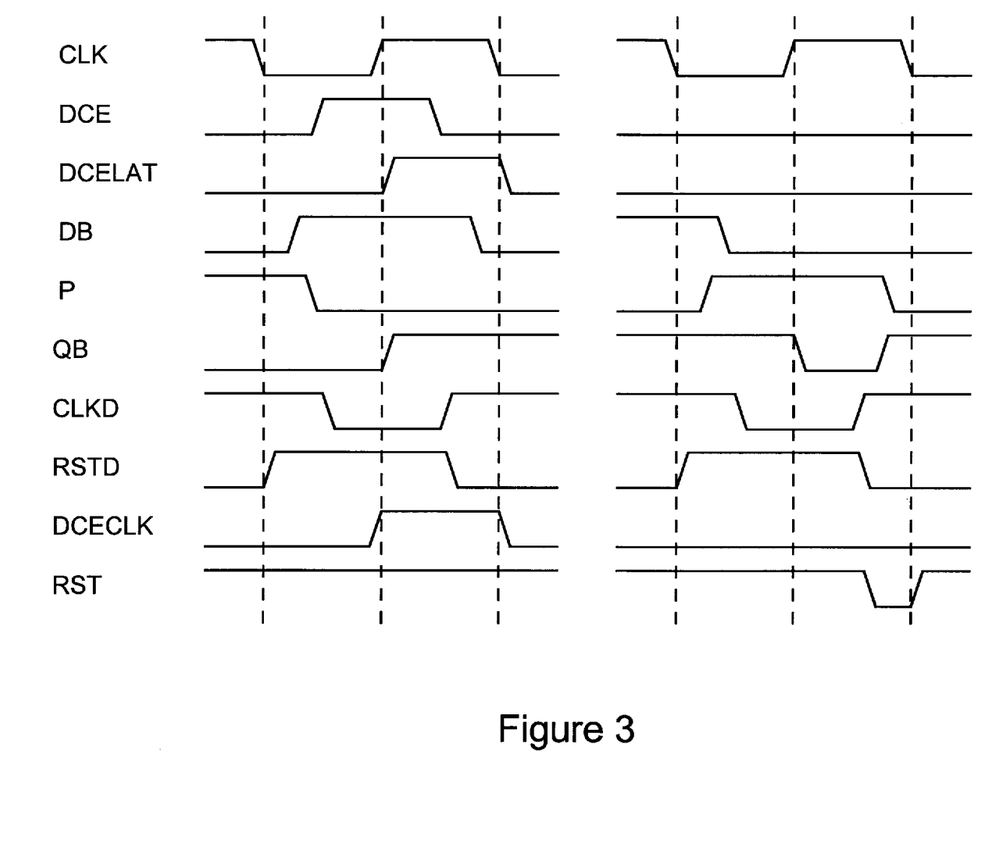
FIG. 3 is a timing diagram of the operation of the novel address enable circuit of FIG. 2.

The chip enable decoding circuit 102 and the chip enable latching circuit 104 are configured, coupled together, and operate as described earlier. Thus, the chip enable decoding circuit 102 receives and decodes the input chip enable signals CE and generates in response the decoded chip enable signal DCE. Then, the decoded chip enable signal DCE is received and latched by the chip enable latching circuit 104 to generate the latched chip enable signal DCELAT. As shown in FIG. 3, this is done when the input clock signal CLK transitions from low (i.e., a logical low level) to high (i.e., a logical high level) at the beginning of a current clock cycle. The current clock cycle ends when the clock signal CLK again transitions from low to high.

Turning back to FIG. 2, the address pre-decoding circuit 106 is also configured and operates as described earlier in receiving and pre-decoding the input address ADD to generate the pre-decoded address DADD during the current clock cycle. And, the address latching circuit 116 is coupled to the address pre-decoding circuit 106 for receiving the pre-decoded address DADD and is coupled to the external memory controller for receiving the input clock signal CLK. Moreover, similar to the address latching circuit 108 of the conventional address enable circuit 100 described earlier, it first inverts the pre-decoded address DADD to its inverted form DADDB and then latches the pre-decoded address DADDB as the input clock signal CLK transitions from low to high during the current clock cycle to generate a synchronized address ADDSYNCB that identifies the pre-decoded address DADDB. In order to do so, the address latching circuit 116 includes parallel inverter gates 115 that each invert a corresponding bit D of the pre-decoded address DADD to generate a corresponding bit DB of the pre-decoded address DADDB. The address latching circuit 116 also includes parallel latches 117 that each latch a corresponding bit DB of the pre-decoded address DADDB as the input clock signal CLK transitions from low to high to generate a corresponding bit QB of the synchronized address ADDSYNCB that identifies the bit DB, as shown in FIG. 3.

Figure 4:
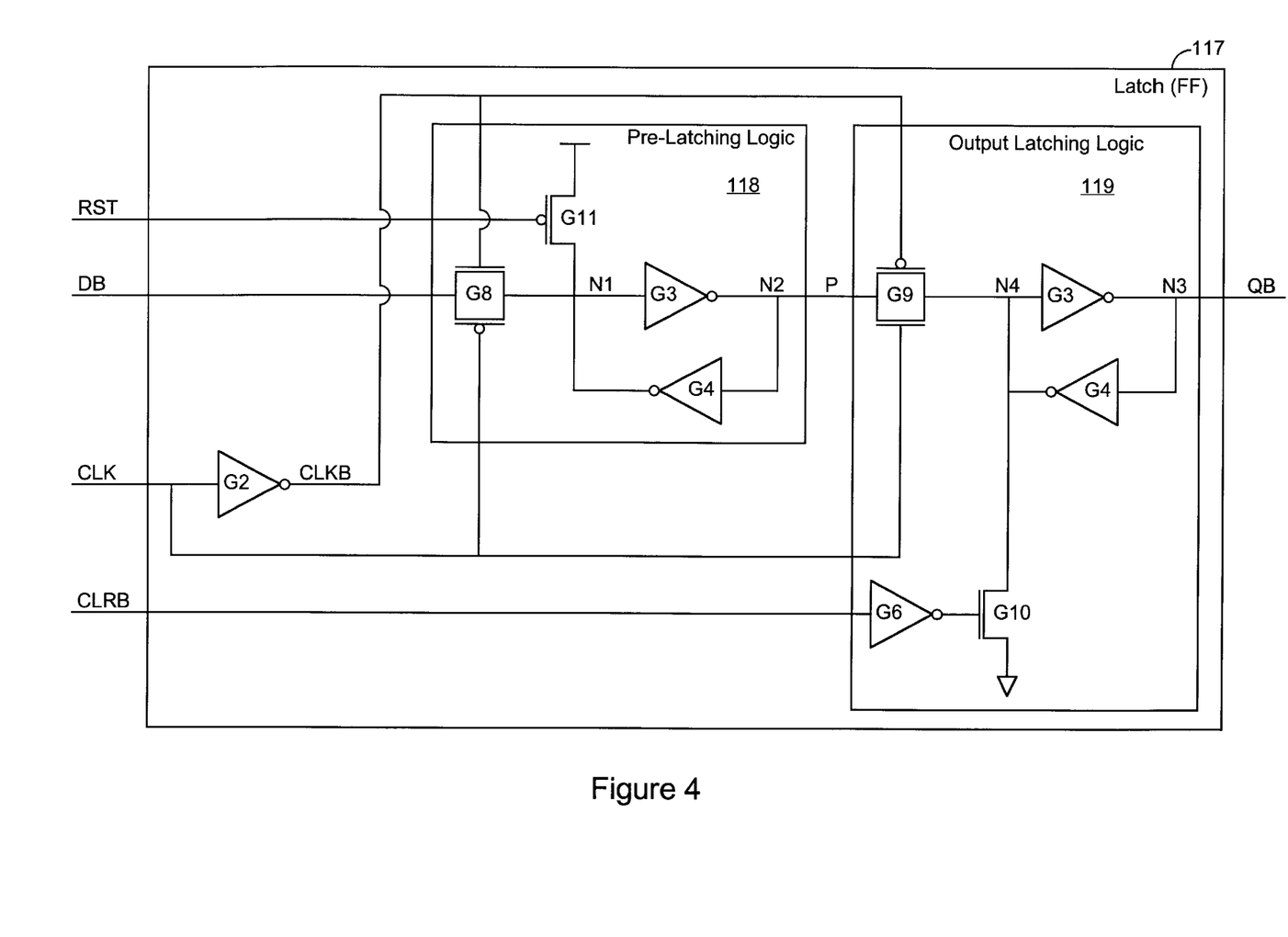
FIG. 4 is a circuit schematic of each latch of the latching circuit of the novel address enable circuit of FIG. 2.

More specifically, each latch 117 may comprise a resetable flip-flop, as shown in FIG. 4. The transfer gate G8 of the pre-latching logic 118 of each latch 117 receives the corresponding bit DB of the pre-decoded address DADDB. And, each latch 117 includes an inverter gate G2 that receives and inverts the input clock signal CLK so as to generate the input clock signal CLKB. Thus, referring also to FIG. 3, when the input clock signals CLK and CLKB respectively transition from low to high and high to low, the transfer gate G8 of the pre-latching logic 118 is turned on and the bit DB is passed by the transfer gate G8 to the node N1 of the pre-latching logic 117. The bit DB is then inverted and pre-latched by the inverter gates G3 and G4 of the pre-latching logic 118 at the node N2 so that the pre-latched bit P that is output by the pre-latching logic 118 at node N2 identifies the bit D.

Since the input clock signals CLK and CLKB are respectively high and low at this point, the transfer gate G9 of the output latching logic 119 of the latch 117 is turned off. Thus, the bit P can not be passed by the transfer gate G9 on to the node N4 of the output latching logic 119. Then, as the input clock signals CLK and CLKB respectively transition from low to high and high to low, the transfer gate G9 is turned on and passes the bit P to the node N4. The bit P is then inverted and latched by the inverter gates G5 and G7 of the output latching logic 119 so that the corresponding latched bit QB of the synchronized address ADDSYNCB that is output by the output latching logic 119 identifies the bit DB of the pre-decoded address DADDB.

Referring back to FIG. 2, unlike the conventional address enable circuit described earlier, the address latching circuit 116 is directly coupled to the drive circuit 120. Thus, the synchronized address ADDSYNCB is directly provided to the drive circuit 120. In response, the drive circuit 120 inverts the synchronized address ADDSYNCB to the synchronized address ADDSYNC and drives the SRAM core with the synchronized address ADDSYNC. Similar to the drive circuit 112 of the conventional address enable circuit 100, the drive circuit 120 includes a corresponding inverter gate 121 for each bit QB of the synchronized address ADDSYNCB. Each inverter gate 121 receives the corresponding bit of the synchronized address ADDSYNCB and inverts the bit QB to generate a corresponding bit Q of the synchronized address ADDSYNC. Each inverter gate 121 is therefore used to drive the SRAM core with the corresponding bit Q of the synchronized address ADDSYNC. However, as will be described later, the size of the inverter gates 121 can be much smaller than the inverter gates 113 in the drive circuit 112 of the conventional address enable circuit 100.

Thus, also referring to FIG. 3, when the input clock signal CLK transitions from low to high during the current clock cycle, the synchronized address ADDSYNCB identifies the pre-decoded address DADDB and is directly provided to the drive circuit 120. As a result, the drive circuit immediately drives the SRAM core with the synchronized address ADDSYNC which identifies the pre-decoded address DADD. And, as will be described shortly, if the latched chip enable signal DCELAT indicates during the current clock cycle that the SRAM has been selected, then the address latching circuit 116 will not be reset. As a result, the drive circuit 120 will continue to drive the SRAM core with this synchronized address ADDSYNC while the input clock signal CLK is high and until the input clock signal CLK transitions from high to low for the next memory access.

But, if the latched chip enable signal DCELAT does indicate during the current clock cycle that the SRAM has not been selected, then the address latching circuit 116 will be reset while the input clock signal CLK is high so that the synchronized address ADDSYNC will no longer identify the pre-decoded address DADD and will instead identify the disabled address that indicates that the core of the SRAM should be disabled for this memory access. Then, the core of the SRAM will be driven by the drive circuit 120 with the synchronized address ADDSYNC that identifies the disabled address until the input clock signal CLK transitions from high to low. As a result, when the latched chip enable signal DCELAT indicates that SRAM has been selected, the memory access time to the core of the SRAM is decreased in comparison to the memory access time when the conventional address enable circuit 100 is used since the synchronized address ADDSYNC will identify the pre-decoded address DADD as soon as the input clock signal transitions from low to high.

Turning again to FIG. 2, in order to reset the address latching circuit 116 during the current clock cycle when the decoded chip enable signal DCE indicates that the SRAM has not been selected and to not reset the address latching circuit 116 during the current clock cycle when the decoded chip enable signal DCE indicates that the chip has been selected, the address enable circuit includes a reset circuit 114. The reset circuit 114 is coupled to the chip enable latching circuit 104 for receiving the latched chip enable signal DCELAT. And, it receives the input clock signal CLK from the external memory controller. In response to the latched chip enable signal DCELAT and the input clock signal CLK, the reset circuit 114 generates a reset signal RST that indicates whether or not to reset the address latching circuit 116. In order to do so, the reset circuit 114 includes reset disable logic 122 and reset logic 124, as shown in FIG. 5.

Figure 5:
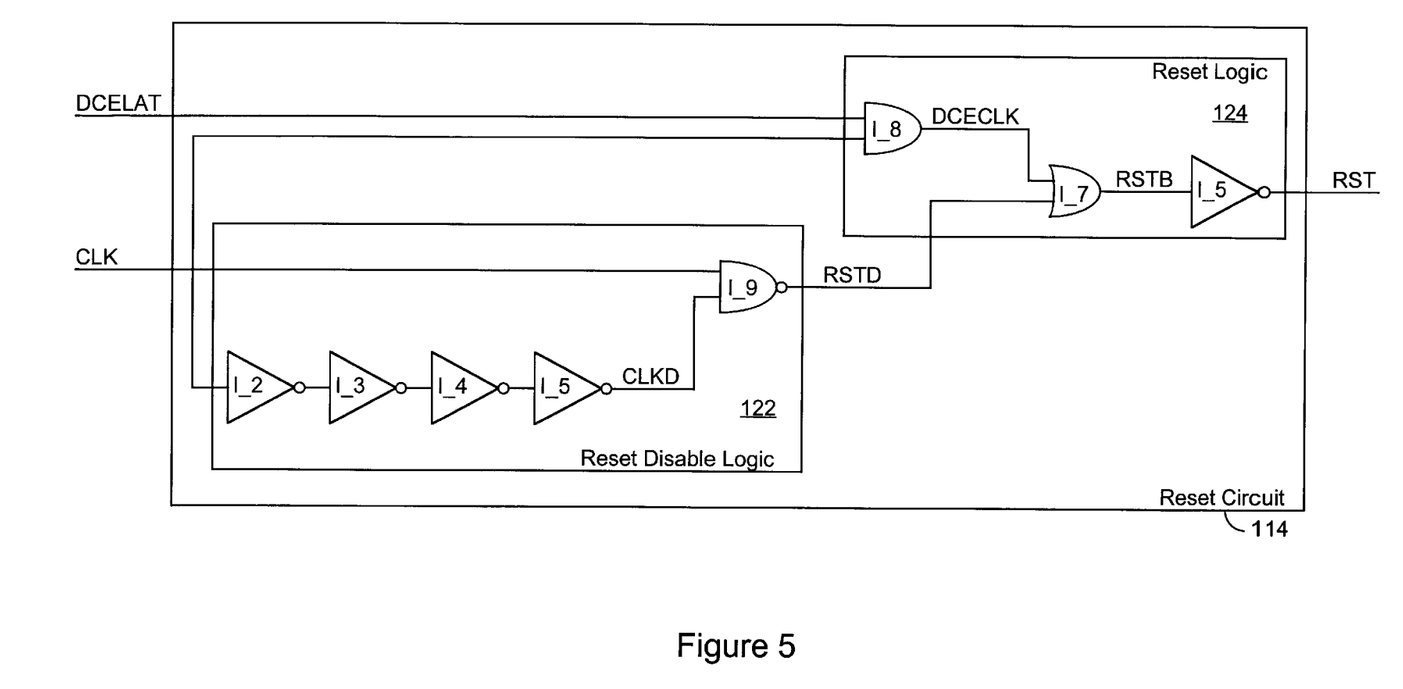
FIG. 5 is a circuit schematic of the reset circuit of the novel address enable circuit of FIG. 2.

Referring now to FIG. 5, as will be more evident shortly, the reset disable logic 122 disables the reset logic 124 from generating a reset signal RST that indicates a reset while the input clock signal is low and during a setup time for the latched chip enable signal DCELAT after the input clock signal CLK transitions from low to high. The setup time is need to properly setup (i.e., establish) the latched chip select signal DCELAT so that there are no glitches or false transients provided to the reset logic 124. Referring also to FIG. 3, the setup time occurs as the input clock signal CLK transitions from the low to high during the current clock cycle and continues while the input clock signal CLK is high. Because of the four gate delay provided by the inverter gates I_2 to I_5 and the one gate delay provided by the NAND gate I_9, the setup time continues until a five gate delay with respect to the input clock signal CLK has passed.

In order to generate the reset disable signal RSTD, the reset disable logic 122 receives the input clock signal CLK and delays it with the four inverter gates I_2 to I_5 of the reset disable logic 122 so as to generate a delayed clock signal CLKD that has a four gate delay with respect to the input clock signal CLK. Then, the delayed clock signal CLKD is NANDed with the input clock signal CLK by the NAND gate I_9 of the reset disable logic 122 to generate the reset disable signal RSTD. As just mentioned, the reset signal indicates when the reset logic 124 should be disabled from generating a reset signal RST that indicates a reset.

The reset logic 124 receives the latched chip enable signal DCELAT, the input clock signal CLK, and the reset disable signal RSTD. The AND gate I_8 of the reset logic 124 ANDs the latched chip enable signal DCELAT and the input clock signal CLK to generate the clocked chip enable signal DCECLK. The clocked chip enable signal DCECLK is then ORed with the reset disable signal RSTD to generate the reset signal RST. This is done using the NOR gate I_7 and the inverter gate I_1 of chip enable logic 124. Specifically, the NOR gate I_7 NORs the clocked chip enable signal DCECLK and the reset disable signal RSTD to generate the reset signal RSTB in inverted form and the inverter gate I_1 inverts the reset signal RSTB to generate the reset signal RST. Thus, the inverter gate I_1 drives the address latching circuit 116 with the reset signal RST.

Referring also to FIG. 3, while the input clock signal CLK is low, the reset disable signal RSTD is high and indicates that the reset logic 124 is disabled from generating a reset signal RST that indicates a reset. And, when the input clock signal CLK transitions from low to high during the current clock cycle, the delayed clock signal CLKD will be low for the four gate delay discussed earlier. As a result, the reset disable signal RSTD will remain high during the five gate setup time for the latched chip enable signal DCELAT and will continue to disable the reset logic 124. This will keep the reset signal RST high during the setup time so that it cannot indicate a reset.

Then, after the latched chip enable signal DCELAT has been setup during the setup time, the reset disable signal RSTD transitions from high to low while the input clock signal CLK is still high. Thus, the reset disable signal RSTD indicates that the reset logic 124 is now enabled for generating a reset signal RST that indicates a reset. Then, while the input clock signal CK is high, the reset signal RST will transition from high to low and indicate a reset if the latched chip enable circuit DCELAT is low and indicates that the SRAM has not been selected. On the other hand, if the latched chip enable circuit DCELAT is high and indicates that the SRAM has been selected, the reset signal RST will remain high and will not indicate a reset. Then, when the input clock signal CLK transitions from high to low for the next clock cycle, the reset disable signal RSTD transitions from low to high and again disables the reset logic 124 from generating a reset signal RST that indicates a reset while the clock signal CLK is low during this next clock cycle.

Referring back to FIG. 2, the address latching circuit 116 is coupled to the reset circuit 114 for receiving the reset signal RST. Thus, as was discussed earlier, when the reset signal RST does not indicate a reset, then the synchronized address ADDSYNC identifies the pre-decoded address DADD. However, when the reset signal RST indicates a reset, then the address latching circuit 116 is reset so that the synchronized address ADDSYNCB no longer identifies the pre-decoded address DADDB and instead identifies the disabled address in inverted form. In order to do so, each latch 117 outputs a corresponding bit Q of the synchronized address ADDSYNCB that identifies a corresponding bit of the disabled address in inverted form.

Referring again to FIGS. 3 and 4, as indicated earlier, in the normal operation of each latch 117 during the current clock cycle, the corresponding bit DB of the pre-decoded address DADDB is first latched by the pre-latching logic 118 when the input and inverted input clock signals CLK and CLKB respectively transition from high to low and low to high. As a result, the corresponding pre-latched bit P at the node N2 identifies the bit D of the pre-decoded address DADD. Then, when the input and inverted input clock signals CLK and CLKB respectively transition from low to high and high to low, the pre-latched bit P is latched by the output latching logic 119 so the corresponding latched bit QB of the synchronized address ADDSYNCB at node N3 identifies the bit DB.

Moreover, while the reset disable signal RSTD is high and indicates that the reset logic 124 is disabled, the reset signal RST is high and cannot not indicate a reset. As a result, the reset gate G11 of the pre-latching logic 118, which comprises a P transistor in this embodiment, is turned off. Thus, while the reset disable signal RSTD is high, the latched bit QB will continue to identify the bit DB. Moreover, after the setup time, when the latched chip enable signal DCELAT indicates that the SRAM has been selected, the reset signal RST remains high after the reset disable signal RSTD has transitioned from high to low and will continue not to indicate a reset. Thus, the latched bit QB will continue to identify the bit DB.

However, after the setup time, when the latched chip enable signal DCELAT indicates that the SRAM has not been selected, the reset signal RST transitions from high to low after the reset disable signal RSTD has transitioned from high to low and will indicate a reset. As a result, the reset gate G11 is turned on and the node N1 of the pre-latching logic 118 is pulled high so that the pre-latched bit P at the node N2 of the pre-latching logic 118 is pulled low and identifies the corresponding bit of the disabled address. In other words, the pre-latching logic 118 is reset by the reset signal RST so that the pre-latched bit is reset to identify this bit of the disabled address. Since the transfer gate G9 is still turned on (because the input clock signals CLK and CLKB are respectively high and low), the pre-latched bit P is passed on to the node N4 of the output latching logic 119 which latches the pre-latched bit P so that the latched bit QB is reset to high to identify the bit of the disabled address in inverted form.

As indicated earlier, when the input clock signal CLK transitions from high to low for the next clock cycle, the reset disable signal RSTD remains high if it was already high and transitions from low to high if it was low so as to disable the reset logic 124. Thus, the reset signal RST correspondingly remains high if it was already high and transitions from low to high if it was low so as to not indicate a reset. This is done so that the latch 117 can operate normally in latching the next pre-decoded address DADD in the next memory access in this next clock cycle.

Thus, referring back to FIG. 2, when the reset signal RST indicates a reset, the synchronized address ADDSYNCB identifies the disabled address in inverted form. In this case, each latch 117 outputs a corresponding bit QB of the synchronized address ADDSYNCB which is high and identifies the corresponding bit of the disabled address in inverted form. Then, the drive circuit 120 drives the SRAM core with the synchronized address ADDSYNC which identifies the disabled address.

However, in an alternative embodiment, the reset gate G11 may comprise an N transistor instead of a P transistor. And, the reset logic 124 may include an extra inverter gate for providing the reset signal RST to the address latching circuit 116 as the reset signal RSTB in inverted form. Thus, the latch 117 would be reset in the manner just described when the reset signal RSTB is high and indicates a reset and would not be reset when the reset signal RSTB is low and does not indicate a reset. Otherwise, the operation and configuration of the address enable circuit 200 would be the same as that just described.

Similarly, in another alternative embodiment where the reset gate G11 comprises an N transistor instead of a P transistor, the reset logic 124 will again include an extra inverter gate for providing the reset signal RST to the address latching circuit as the reset disable signal RSTB in inverted form. However, in this embodiment, the N transistor would be coupled to ground instead of VCC, the latching circuit 116 would not include the inverter gates 115, and the drive circuit 120 would include extra inverter gates.

Thus, the latching circuit 116 would latch the pre-decoded address DADD instead of the pre-decoded address DADDB in inverted form and would output the synchronized address ADDSYNC instead of the synchronized address ADDSYNCB in inverted form. This would be done in the same manner as described earlier except that each latch 117 would receive the corresponding bit D of the pre-decoded address DADD and output the corresponding bit Q of the synchronized address ADDSYNC. Thus, the extra inverter gates of the drive circuit would invert the synchronized address ADDSYNC to generate the synchronized address ADDSYNCB in inverted form. Here, each extra inverter gate would then invert the corresponding bit Q of the synchronized address ADDSYNC to generate the corresponding bit QB of the synchronized address ADDSYNCB.

Then, the driving inverter gates 121 of the drive circuit would generate the synchronized address ADDSYNC in the manner discussed earlier.

Furthermore, the latch 117 would be reset when the reset signal RSTB is high and indicates a reset and would not be reset when the reset signal RSTB is low and does not indicate a reset. But, in this embodiment, the N transistor in each latch 117 would pull the node N1 low instead of high so that the corresponding bit Q of the synchronized address ADDSYNC would be reset to low. Then, since the drive circuit includes the extra inverter gates, the synchronized address ADDSYNC output by the drive circuit 120 would properly identify the disabled address. Otherwise, the resetting of the address latching circuit 116 would be the same as that just described.

As indicated earlier, in the conventional address enable circuit 100, the chip enable latching circuit 105 must drive the multiple NAND gates 111 of the NAND circuit 110 with the latched chip enable signal DCELAT. However, in the novel address enable circuit 200 shown in FIG. 2, the chip enable latching circuit 105 must only drive the AND gate I_8 of the reset circuit 114 with the latched chip enable signal DCELAT and only one inverter gate I_1 is needed to drive the address latching circuit 116 with the reset signal RST, as shown in FIG. 5. Thus, in the novel address enable circuit 200, the large layout area of the NAND circuit 110 in the conventional address enable circuit 100 is avoided and the large power consumption needed to drive the NAND circuit 110 is also avoided.

Finally, while the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. An address enable circuit for use in a synchronous memory that includes a memory core, the address enable circuit comprising:

a chip enable decoding circuit that decodes input chip enable signals to generate a decoded chip enable signal that indicates whether the memory has been selected;

a chip enable latching circuit that latches the decoded chip enable signal to generate a latched chip enable signal when an input clock signal transitions from a first logical level to a second logical level;

an address pre-decoding circuit that pre-decodes an input address to generate a pre-decoded address that is distinct from a predefined disabled address that indicates that memory access to the memory core is disabled;

an address latching circuit that latches the pre-decoded address when the input clock signal transitions from the first logical level to the second logical level so as to output a synchronized address that identifies the pre-decoded address;

a reset circuit that generates a reset signal that (1) does not indicate a reset when the latched chip enable signal indicates that the memory has been selected while the clock signal is at the second logical level, (2) indicates a reset when the latched chip enable signal indicates that the memory has not been selected while the clock signal is at the second logical level, and (3) does not indicate a reset while the clock signal is at the first logical level;

the address latching circuit (1) being reset when the reset signal indicates a reset so that the synchronized address identifies the disabled address, and (2) not being reset when the reset signal does not indicate a reset so that the synchronized address continues to identify the pre-decoded address;

a drive circuit that drives the memory core with the synchronized address.

2. The address enable circuit of claim 1 wherein the reset circuit comprises:

reset logic that generates the reset signal so that the reset signal (1) does not indicate a reset while a reset disable signal indicates that the reset logic is disabled, (2) does not indicate a reset while (a) the reset disable signal indicates that the reset logic is not disabled, the input clock signal is at the second logical level, and (b) the latched chip enable signal indicates that the memory has been selected, (3) indicates a reset while (a) the reset disable signal indicates that the reset logic is not disabled, (b) the input clock signal is at the second logical level, and (c) the latched chip enable signal indicates that the memory has not been selected;

reset disable logic that generates the reset disable signal, the reset disable signal indicating that the reset logic is disabled (1) during the setup time for setting up the latched chip enable signal while the input clock signal is at the second logical level after the input clock signal transitions from the first logical level to the second logical level, and (2) while the input clock signal is at the first logical level, the reset disable signal indicating that the reset logic is not disabled after the setup time while the input clock signal is at the second logic level.

3. The address enable circuit of claim 1 wherein, for each bit of the pre-decoded address, the address latching circuit includes a corresponding latch that comprises:

pre-latching logic that pre-latches the bit of the pre-decoded address when the input clock signal is at the first logical level so as to generate a pre-latched bit that identifies the bit of the pre-decoded address;

output latching logic that latches the pre-latched bit when the input clock signal transitions from the first logical level to the second logical level so as to output a corresponding bit of the synchronized address that identifies the the bit of the pre-decoded address;

the pre-latching logic being reset when the reset signal indicates a reset so that the pre-latched bit is reset to identify a corresponding bit of the disabled address;

the output latching logic latching the pre-latched bit when the pre-latched bit is reset so that the corresponding bit of the synchronized address identifies the corresponding bit of the disabled address while the input clock signal is at the second logical level.

4. The address enable circuit of claim 2 wherein:

the reset logic comprises logic gates to (1) AND the latched chip enable signal and the input clock signal so as to generate a clocked chip enable signal, and (2) OR the clocked chip enable signal and the reset disable signal so as to generate the reset signal; and the reset disable logic comprises logic gates to (1) to delay the input clock signal so as to generate a delayed clock signal that has a first gate delay with respect to the input clock signal, and (2) NAND the delayed clock signal and the input clock signal over a second gate delay so as to generate the reset disable signal with the setup time comprising the first and second gate delays.

5. The address enable circuit of claim 3 wherein, for each bit of the pre-decoded address:

the address latching circuit further comprises a corresponding inverter gate that inverts the bit of the pre-decoded address so as to provide the bit of the pre-decoded address in inverted form to the pre-latching logic of the corresponding latch;

the pre-latching logic of the corresponding latch comprises a first node, a second node, a pre-latching transfer gate, pre-latching inverter gates, and a reset gate so that (1) when the input clock signal is at the first logical level, (a) the pre-latching transfer gate passes the bit of the pre-decoded address in inverted form to the first node, and (b) the pre-latching inverter gates invert and pre-latch the bit of the pre-decoded address in inverted form at the first node as the pre-latched bit at the second node so that the pre-latched bit identifies the bit of the pre-decoded address, and (2) when the reset signal indicates a reset, (a) the reset gate causes the first node to identify a corresponding bit of the disabled address in inverted form, and (b) the pre-latching inverter gates invert and pre-latch the corresponding bit of the disabled address in inverted form at the first node as the pre-latched bit at the second node so that the pre-latched bit is reset to identify the corresponding bit of the disabled address;

the output latching logic of the corresponding latch comprises a third node, a fourth node, an output latching transfer gate, and output latching inverter gates so that (1) when the input clock signal transitions from the first logical level to the second logical level, (a) the output latching transfer gate passes the pre-latched bit that identifies the bit of the pre-decoded address to the third node, and (b) the output latching inverter gates invert and latch the pre-latched bit at the third node as the corresponding bit of the synchronized address in inverted form at the fourth node so that the corresponding bit of the synchronized address in inverted form identifies the corresponding bit of the pre-decoded address in inverted form, and (2) when the reset signal indicates a reset, (a) the output latching transfer gate passes the pre-latched bit that identifies the corresponding bit of the disabled address to the third node, and (b) the output latching inverter gates invert and latch the pre-latched bit at the third node as the corresponding bit of the synchronized address in inverted form at the fourth node so that the corresponding bit of the synchronized address in inverted form identifies the corresponding bit of the disabled address in inverted form; and the drive circuit comprises a corresponding inverter gate that inverts the corresponding bit of the synchronized address in inverted form so as to drive the memory core with the corresponding bit of the synchronized address.

6. The address enable circuit of claim 3 wherein, for each bit of the pre-decoded address:

the pre-latching logic of the corresponding latch comprises a first node, a second node, a pre-latching transfer gate, pre-latching inverter gates, and a reset gate so that (1) when the input clock signal is at the first logical level, (a) the pre-latching transfer gate passes the bit of the pre-decoded address to the first node, and (b) the pre-latching inverter gates invert and pre-latch the bit of the pre-decoded address at the first node as a pre-latched bit at the second node so that the pre-latched bit identifies the bit of the pre-decoded address in inverted form, and (2) when the reset signal indicates a reset, (a) the reset gate causes the first node to identify a corresponding bit of the disabled address, and (b) the pre-latching inverter gates invert and pre-latch the corresponding bit of the disabled address at the first node as the pre-latched bit at the second node so that the pre-latched bit is reset to identify the corresponding bit of the disabled address in inverted form;

the output latching logic of the corresponding latch comprises a third node, a fourth node, an output latching transfer gate, and output latching inverter gates so that (1) when the input clock signal transitions from the first logical level to the second logical level, (a) the output latching transfer gate passes the pre-latched bit that identifies the bit of the pre-decoded address in inverted form to the third node, and (b) the output latching inverter gates invert and latch the pre-latched bit at the third node as the corresponding bit of the synchronized address at the fourth node so that the corresponding bit of the synchronized address identifies the corresponding bit of the pre-decoded address, and (2) when the reset signal indicates a reset, (a) the output latching transfer gate passes the pre-latched bit that identifies the corresponding bit of the disabled address in inverted form to the third node, and (b) the output latching inverter gates invert and latch the pre-latched bit at the third node as the corresponding bit of the synchronized address at the fourth node so that the corresponding bit of the synchronized address identifies the corresponding bit of the disabled address; and the drive circuit comprises a first inverter gate to invert the corresponding bit of the synchronized address to provide the corresponding bit of the synchronized address in inverted form and a second inverter gate to invert the corresponding bit of the synchronized address in inverted form so as to drive the memory core with the corresponding bit of the synchronized address.

7. A method of driving a memory core of synchronous memory with a synchronous address, the method comprising the steps of:

decoding input chip enable signals to generate a decoded chip enable signal that indicates whether the memory has been selected;

latching the decoded chip enable signal to generate a latched chip enable signal when an input clock signal transitions from a first logical level to a second logical level;

pre-decoding an input address to generate a pre-decoded address that is distinct from a predefined disabled address that indicates that memory access to the memory core is disabled;

latching the pre-decoded address when the input clock signal transitions from the first logical level to the second logical level so as to output a synchronized address that identifies the pre-decoded address;

generating a reset signal that (1) does not indicate a reset when the latched chip enable signal indicates that the memory has been selected while the clock signal is at the second logical level, (2) indicates a reset when the latched chip enable signal indicates that the memory has not been selected while the clock signal is at the second logical level, and (3) does not indicate a reset while the clock signal is at the first logical level;

resetting the synchronized address to identify the disabled address when the reset signal indicates a reset;

not resetting the synchronized address when the reset signal does not indicate a reset so that the synchronized address continues to identify the pre-decoded address; and driving the memory core with the synchronized address.

8. The method of claim 7 wherein the step of generating the reset signal comprises the steps of:

generating a reset disable signal that (1) indicates that resetting is disabled (a) during the setup time for setting up the latched chip enable signal while the input clock signal is at the second logical level after the input clock signal transitions from the first logical level to the second logical level, and (b) while the input clock signal is at the first logical level, and (2) indicates that resetting is not disabled after the setup time while the input clock signal is at the second logic level;

generating the reset signal so that the reset signal (1) does not indicate a reset while the reset disable signal indicates that resetting is disabled, (2) does not indicate a reset while (a) the reset disable signal indicates that resetting is not disabled, (b) the input clock signal is at the second logical level, and (c) the latched chip enable signal indicates that the memory has been selected, (3) indicates a reset while (a) the reset disable signal indicates that resetting is not disabled, (b) the input clock signal is at the second logical level, and (c) the latched chip enable signal indicates that the memory has not been selected.

9. The method of claim 8 wherein:

the step of generating the reset disable signal comprises the steps of:

delaying the input clock signal so as to generate a delayed clock signal that has a first gate delay with respect to the input clock signal; and NANDing the delayed clock signal and the input clock signal over a second gate delay so as to generate the reset disable signal with the setup time comprising the first and second gate delays; and the step of generating the reset signal comprises the steps of:

ANDing the latched chip enable signal and the input clock signal so as to generate a clocked chip enable signal; and ORing the clocked chip enable signal and the reset disable signal so as to generate the reset signal.

10. The method of claim 7 wherein, for each bit of the pre-decoded address:

the step of latching the pre-decoded address comprises the steps of:

pre-latching the bit of the pre-decoded address when the input clock signal is at the first logical level so as to generate a pre-latched bit that identifies the bit of the pre-decoded address; and latching the pre-latched bit when the input clock signal transitions from the first logical level to the second logical level so as to output a corresponding bit of the synchronized address that identifies the bit of the pre-decoded address; and the step of resetting the synchronous address comprises the steps of:

resetting the pre-latched bit when the reset signal indicates a reset so that the pre-latched bit is reset to identify a corresponding bit of the disabled address; and latching the pre-latched bit when the pre-latched bit is reset so that the corresponding bit of the synchronized address identifies the corresponding bit of the disabled address while the input clock signal is at the second logical level.

11. The method of claim 10 wherein, for each bit of the pre-decoded address:

the step of latching the pre-decoded address further comprises the step of inverting the bit of the pre-decoded address so as to provide the bit of the pre-decoded address in inverted form;

the step of pre-latching the bit of the pre-decoded address comprises the steps of:

passing the bit of the pre-decoded address in inverted form to a first node; and inverting and pre-latching the bit of the pre-decoded address in inverted form at the first node as the pre-latched bit at a second node so that the pre-latched bit identifies the bit of the pre-decoded address;

the step of latching the pre-latched bit comprises the steps of:

passing the pre-latched bit that identifies the bit of the pre-decoded address to a third node; and inverting and latching the pre-latched bit that identifies the bit of the pre-decoded address at the third node as the corresponding bit of the synchronized address in inverted form at the fourth node so that the corresponding bit of the synchronized address in inverted form identifies the bit of the pre-decoded address in inverted form;

the step of resetting the pre-latched bit comprises the steps of:

causing the first node to identify the corresponding bit of the disabled address in inverted form; and inverting and pre-latching the corresponding bit of the disabled address in inverted form at the first node as the pre-latched bit at the second node so that the pre-latched bit is reset to identify the corresponding bit of the disabled address;

the step of resetting the corresponding bit of the synchronous address comprises the steps of:

passing the pre-latched bit that identifies the corresponding bit of the disabled address to the third node; and inverting and latching the pre-latched bit that identifies the corresponding bit of the disabled address at the third node as the corresponding bit of the synchronized address in inverted form at the fourth node so that the corresponding bit of the synchronized address in inverted form identifies the corresponding bit of the disabled address in inverted form;

the step of driving the memory core comprises the step of inverting the corresponding bit of the synchronized address in inverted form at the fourth node so as to drive the memory core with the corresponding bit of the synchronized address.

12. The method of claim 10 wherein, for each bit of the pre-decoded address:

the step of pre-latching the bit of the pre-decoded address comprises the steps of:

passing the bit of the pre-decoded address to a first node; and inverting and pre-latching the bit of the pre-decoded address at the first node as the pre-latched bit at a second node so that the pre-latched bit identifies the bit of the pre-decoded address in inverted form;

the step of latching the pre-latched bit comprises the steps of:

passing the pre-latched bit that identifies the bit of the pre-decoded address in inverted form to a third node; and inverting and latching the pre-latched bit that identifies the bit of the pre-decoded address in inverted form at the third node as the corresponding bit of the synchronized address at the fourth node so that the corresponding bit of the synchronized address identifies the bit of the pre-decoded address;

the step of resetting the pre-latched bit comprises the steps of:
   causing the first node to identify the corresponding bit of the disabled address; and
   inverting and pre-latching the corresponding bit of the disabled address at the first node as the pre-latched bit at the second node so that the pre-latched bit is reset to identify the corresponding bit of the disabled address in inverted form;

the step of resetting the corresponding bit of the synchronous address comprises the steps of:
   passing the pre-latched bit that identifies the corresponding bit of the disabled address in inverted form to the third node; and
   inverting and latching the pre-latched bit that identifies the corresponding bit of the disabled address in inverted form at the third node as the corresponding bit of the synchronized address at the fourth node so that the corresponding bit of the synchronized address identifies the corresponding bit of the disabled address;

the step of driving the memory core comprises the steps of:
   inverting the corresponding bit of the synchronized address at the fourth node so as to provide the corresponding bit of the synchronized address in inverted form; and
   inverting the corresponding bit of the synchronized address in inverted form to drive the memory core with the corresponding bit of the synchronized address.

* * * * *